United States Patent
Kobayashi et al.

(10) Patent No.: US 9,832,870 B2
(45) Date of Patent: Nov. 28, 2017

(54) RESIN COMPOSITION, PREPREG, METAL FOIL-CLAD LAMINATE AND PRINTED WIRING BOARD

(71) Applicant: MITSUBISHI GAS CHEMICAL COMPANY, INC., Tokyo (JP)

(72) Inventors: Hiroaki Kobayashi, Fukushima (JP); Masanobu Sogame, Tokyo (JP); Kentaro Nomizu, Tokyo (JP); Yoshinori Mabuchi, Tokyo (JP); Yoshihiro Kato, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 106 days.

(21) Appl. No.: 14/407,190

(22) PCT Filed: Jun. 6, 2013

(86) PCT No.: PCT/JP2013/065678
§ 371 (c)(1),
(2) Date: Dec. 11, 2014

(87) PCT Pub. No.: WO2013/187303
PCT Pub. Date: Dec. 19, 2013

(65) Prior Publication Data
US 2015/0181707 A1 Jun. 25, 2015

(30) Foreign Application Priority Data
Jun. 12, 2012 (JP) .................. 2012-132685

(51) Int. Cl.
| | | |
|---|---|---|
| *B32B 3/10* | (2006.01) | |
| *H05K 1/03* | (2006.01) | |
| *C08J 5/24* | (2006.01) | |
| *C08L 63/00* | (2006.01) | |
| *C08G 59/40* | (2006.01) | |
| *B32B 15/14* | (2006.01) | |
| *B32B 15/20* | (2006.01) | |
| *C08K 9/02* | (2006.01) | |
| *B32B 5/02* | (2006.01) | |
| *H05K 1/05* | (2006.01) | |
| *C08K 3/14* | (2006.01) | |

(52) U.S. Cl.
CPC .......... *H05K 1/0366* (2013.01); *B32B 5/022* (2013.01); *B32B 5/024* (2013.01); *B32B 15/14* (2013.01); *B32B 15/20* (2013.01); *C08G 59/4014* (2013.01); *C08J 5/24* (2013.01); *C08K 9/02* (2013.01); *C08L 63/00* (2013.01); *H05K 1/0373* (2013.01); *H05K 1/056* (2013.01); *B32B 2260/021* (2013.01); *B32B 2260/046* (2013.01); *B32B 2262/101* (2013.01); *B32B 2307/304* (2013.01); *B32B 2307/306* (2013.01); *B32B 2307/5825* (2013.01); *B32B 2307/726* (2013.01); *B32B 2457/08* (2013.01); *C08J 2363/02* (2013.01); *C08J 2363/04* (2013.01); *C08K 3/14* (2013.01); *H05K 1/0353* (2013.01); *H05K 2201/0209* (2013.01); *H05K 2201/0224* (2013.01); *H05K 2201/0227* (2013.01); *Y10T 428/24893* (2015.01); *Y10T 442/2721* (2015.04); *Y10T 442/3415* (2015.04); *Y10T 442/3423* (2015.04); *Y10T 442/656* (2015.04)

(58) Field of Classification Search
None
See application file for complete search history.

(56) References Cited

U.S. PATENT DOCUMENTS

| | | | | |
|---|---|---|---|---|
| 2005/0277743 A1* | 12/2005 | Nozaki | .................. | B32B 27/04 525/403 |
| 2008/0187763 A1 | 8/2008 | Kato et al. | | |
| 2013/0157061 A1* | 6/2013 | Sogame | .................. | B32B 27/38 428/418 |

FOREIGN PATENT DOCUMENTS

| | | |
|---|---|---|
| DE | 1956066 | 4/1971 |
| JP | 55-025461 | 2/1980 |
| JP | 59-022974 | 2/1984 |
| JP | 63-201047 | 8/1988 |
| JP | 7-202364 | 8/1995 |
| JP | 2007-45984 | 2/2007 |
| JP | 2012-106888 | 6/2012 |
| JP | 2012106888 A * | 6/2012 |
| SG | 186089 | 1/2013 |
| TW | 201211144 | 3/2012 |

(Continued)

OTHER PUBLICATIONS

Machine translation of JP 2012-106888 Retrieved on Sep. 27, 2016.*

(Continued)

*Primary Examiner* — Christopher Polley
(74) *Attorney, Agent, or Firm* — Greenblum & Bernstein, P.L.C.

(57) ABSTRACT

A resin composition capable of achieving a printed wiring board or the like excellent in heat dissipation properties, water absorption properties, copper foil peel strength, and heat resistance after moisture absorption is provided. A prepreg, a laminate, a metal foil clad laminate, a printed wiring board and the like, which use the resin composition are also provided. The resin composition of the present invention having at least an epoxy resin, a cyanate ester compound, and an inorganic filler, wherein the inorganic filler includes at least a surface-treated silicon carbide of a silicon carbide powder having at least a part of the surface treated with an inorganic oxide.

11 Claims, No Drawings

(56) References Cited

FOREIGN PATENT DOCUMENTS

WO        2011/152402     12/2011
WO     WO 2011152402 A1 * 12/2011    ............. B32B 27/38

OTHER PUBLICATIONS

Search report from PCT/JP2013/065678, dated Aug. 27, 2013.
International Preliminary Report on Patentability dated Dec. 16, 2014 in PCT/JP2013/065678.

* cited by examiner

_(1)_

RESIN COMPOSITION, PREPREG, METAL FOIL-CLAD LAMINATE AND PRINTED WIRING BOARD

TECHNICAL FIELD

The present invention relates to a resin composition, a prepreg, a metal foil clad laminate, and a printed wiring board, and more specifically to a resin composition or the like suitable for use as a prepreg for a printed wiring board.

BACKGROUND ART

In recent years, the development in higher integration, higher performance, and higher density packaging of semiconductors for use in electronic devices, communication instruments, personal computers, and the like has been progressively accelerated. Consequently, a laminate having excellent properties such as heat resistance and low water absorption properties is required as a metal foil clad laminate for use in a printed wiring board. Conventionally, FR-4 type laminates made of epoxy resin cured by dicyandiamide are widely used as a laminate for use in a printed wiring board. The recent requirement for high heat resistance, however, is beyond the limit of performance of the laminates of this type.

On the other hand, cyanate ester resins are known as resins for use in a printed wiring board, having excellent heat resistance. Recently, a resin composition obtained by, for example, mixing a bisphenol A-based cyanate ester resin with other thermosetting resins or other thermoplastic resins has widely been used as a resin composition for high functional printed wiring boards for semiconductor plastic packages and the like. Although the bisphenol A-based cyanate ester resin is excellent in electrical properties, mechanical properties, chemical resistance, adhesion, and the like, water absorption properties and heat resistance after moisture absorption under severe conditions are insufficient in some cases. The development of cyanate ester resins having other structures is, therefore, under way for further improvement in properties.

With the development in higher integration, higher performance, and higher density packaging of semiconductors, the high heat dissipation properties of a printed wiring board has been emphasized. A laminate having high heat resistance, low water absorption properties, and high thermal conductivity is, therefore, needed. For example, a resin composition containing a cyanate ester resin (A) having a specific structure, a non-halogen epoxy resin (B), and an inorganic filler (C) as essential components has been proposed as a flame-retardant resin composition for a halogen-free laminate having improved curability, water absorption rate, heat resistance after moisture absorption, and insulation reliability (refer to Patent literature 1).

Further, an electrically insulating resin composition having improved thermal conductivity with a large amount of inorganic filler having a specific particle size distribution has been proposed (refer to Patent Literature 2).

CITATION LIST

Patent Literature

Patent Literature 1
Japanese Patent Laid-Open No. 2007-45984
Patent Literature 2
Japanese Patent Laid-Open No. 7-202364

SUMMARY OF INVENTION

Technical Problem

However, the flame-retardant resin composition described in Patent Literature 1 has insufficient heat dissipation properties. Further, the electrically insulating resin composition described in Patent Literature 2 has difficulty in achieving both high heat dissipation properties and low water absorption properties due to the high compounding ratio of an inorganic filler which increases the water absorption rate of the electrically insulating resin composition.

In view of the foregoing problems, an object of the present invention is to provide a resin composition capable of achieving a printed wiring board or the like excellent in heat dissipation properties, water absorption properties, copper foil peel strength, and heat resistance after moisture absorption. Another object is to provide a prepreg, a laminate, a metal foil clad laminate, a printed wiring board and the like, which use the resin composition.

Solution to Problem

As a result of intensive studies for solving such problems, the present inventors have found that by using a resin composition comprising at least an epoxy resin, a cyanate ester compound, and an inorganic filler of silicon carbide powder having at least a part of the surface treated with an inorganic oxide, a metal foil clad laminate for a printed wiring board or the like for solving the problems can be obtained, so that the present invention has been completed. More specifically, the present invention provides items <1> to <21> as described below.

<1> A resin composition comprising at least an epoxy resin (A), a cyanate ester compound (B), and an inorganic filler (C), wherein the inorganic filler (C) comprises at least a surface-treated silicon carbide (C-1) of a silicon carbide powder having at least a part of the surface treated with an inorganic oxide.

<2> The resin composition according to the item <1>, wherein the surface-treated silicon carbide (C-1) comprises a core particle of the silicon carbide powder and the inorganic oxide formed on at least a part of the surface of the core particle.

<3> The resin composition according to the item <2>, wherein the core particle has an average particle diameter of 0.5 to 20 μm.

<4> The resin composition according to any one of the items <1> to <3>, wherein the inorganic oxide is at least one or more selected from the group consisting of silica, titania, alumina, and zirconium oxide.

<5> The resin composition according to any one of the items <1> to <4>, wherein the inorganic oxide has a thickness of 10 to 70 nm.

<6> The resin composition according to any one of the items <1> to <5>, wherein the inorganic filler (C) is contained in an amount of 150 to 900 parts by mass based on a total of 100 parts by mass of resin solid components.

<7> The resin composition according to any one of the items <1> to <6>,
wherein the surface-treated silicon carbide (C-1) is contained in an amount of 150 to 600 parts by mass based on a total of 100 parts by mass of resin solid components.

<8> The resin composition according to any one of the items <1> to <7>,
wherein the inorganic filler (C) further comprises at least one or more second inorganic fillers (C-2) selected from the group consisting of alumina, magnesium oxide, boron nitride, and aluminum nitride, other than the surface-treated silicon carbide (C-1).

<9> The resin composition according to the item <8>,
wherein the second inorganic filler (C-2) is contained in an amount of 150 to 500 parts by mass based on a total of 100 parts by mass of resin solid components.

<10> The resin composition according to any one of the items <1> to <9>,
wherein the epoxy resin (A) is at least one or more selected from the group consisting of a biphenyl aralkyl-based epoxy resin, a polyoxynaphthylene-based epoxy resin, a triphenolmethane-based epoxy resin, a bisphenol A-based epoxy resin, a bisphenol F-based epoxy resin, a phenol novolac-based epoxy resin, a cresol novolac-based epoxy resin, a bisphenol A novolac-based epoxy resin, a brominated bisphenol A-based epoxy resin, a brominated phenol novolac-based epoxy resin, a biphenyl-based epoxy resin, a phenol aralkyl-based epoxy resin, and naphthol aralkyl-based epoxy resin.

<11> The resin composition according to any one of the items <1> to <10>,
wherein the cyanate ester compound (B) is at least one or more selected from the group consisting of a naphthol aralkyl-based cyanate ester compound represented by the following general formula (1), a novolac-based cyanate ester compound represented by the following general formula (2), and a biphenyl aralkyl-based cyanate ester compound represented by the following general formula (3):

[Formula 1]

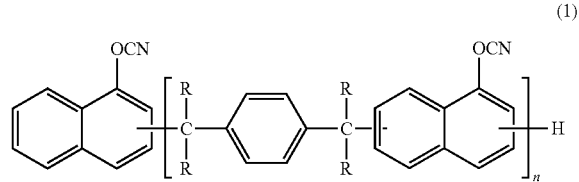

(1)

wherein each R independently represents a hydrogen atom or a methyl group, and n represents an integer of 1 or more;

[Formula 2]

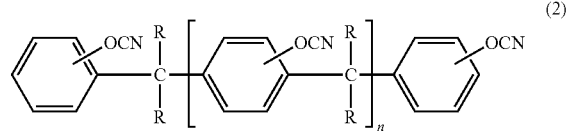

(2)

wherein each R independently represents a hydrogen atom or a methyl group, and n represents an integer of 0 or more;

[Formula 3]

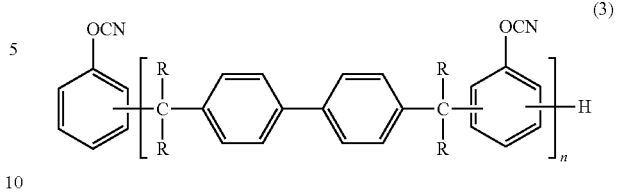

(3)

wherein each R independently represents a hydrogen atom or a methyl group, and n represents an integer of 1 or more.

<12> The resin composition according to any one of the items <1> to <11>,
wherein the epoxy resin (A) is contained in an amount of 10 to 90 parts by mass based on a total of 100 parts by mass of the epoxy resin (A) and the cyanate ester compound (B).

<13> The resin composition according to any one of the items <1> to <12>,
wherein the cyanate ester compound (B) is contained in an amount of 10 to 90 parts by mass based on a total of 100 parts by mass of the epoxy resin (A) and the cyanate ester compound (B).

<14> The resin composition according to any one of the items <1> to <13>, further comprising a maleimide compound (D).

<15> The resin composition according to the item <14>,
wherein the maleimide compound (D) is at least one or more selected from the group consisting of bis(4-maleimidophenyl)methane, 2,2-bis(4-(4-maleimidephenoxy)phenyl) propane, bis(3-ethyl-5-methyl-4-maleimidophenyl) methane, and a maleimide compound represented by the following general formula (4):

[Formula 4]

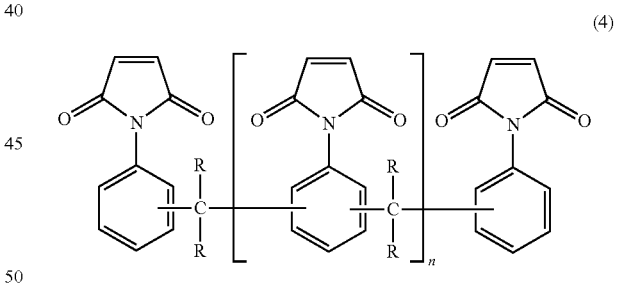

(4)

wherein each R independently represents a hydrogen atom or a methyl group, and n represents an integer of 1 to 10 as an average value.

<16> The resin composition according to the item <14> or <15>,
wherein the maleimide compound (D) is contained in an amount of 5 to 50 parts by mass based on a total of 100 parts by mass of the epoxy resin (A), the cyanate ester compound (B), and the maleimide compound (D).

<17> The resin composition according to any one of the items <14> to <16>,
wherein the epoxy resin (A) is contained in an amount of 10 to 90 parts by mass based on a total of 100 parts by mass of the epoxy resin (A), the cyanate ester compound (B), and the maleimide compound (D).

<18> The resin composition according to any one of the items <14> to <17>,
wherein the cyanate ester compound (B) is contained in an amount of 10 to 90 parts by mass based on a total of 100 parts by mass of the epoxy resin (A), the cyanate ester compound (B), and the maleimide compound (D).

<19> A prepreg comprising a substrate and the resin composition according to any one of the items <1> to <18> which the substrate is impregnated with or which is attached to the substrate.

<20> A metal foil clad laminate comprising the prepreg according to the item <19> as an insulating layer, and a metal foil disposed on a single side or both sides of the prepreg.

<21> A printed wiring board comprising an insulating layer and a conductive layer formed on the surface of the insulating layer, wherein the insulating layer comprises the resin composition according to any one of the items <1> to <18>.

Advantageous Effects of Invention

According to the present invention, a resin composition capable of achieving a prepreg, a metal foil clad laminate, a printed wiring board and the like excellent in heat dissipation properties, water absorption rate, copper foil peel strength, and heat resistance after moisture absorption can be provided. The industrial usefulness thereof is extremely high.

DESCRIPTION OF EMBODIMENTS

Embodiments of the present invention are described in the following. The following embodiments are, however, provided to illustrate the present invention, and the present invention is not limited thereto only.

The resin composition in the present embodiments is a resin composition comprising at least an epoxy resin (A), a cyanate ester compound (B), and an inorganic filler (C), wherein the inorganic filler (C) comprises at least a surface-treated silicon carbide (C-1) of silicon carbide powder having at least a part of the surface treated with an inorganic oxide.

A known compound having 2 or more epoxy groups in one molecule may be appropriately used as the epoxy resin (A) for use in the resin composition of the present embodiment, without particular limitations on the type. Examples of the compound include: a glycidyl ether epoxy resin such as a bisphenol A-based epoxy resin, a bisphenol E-based epoxy resin, a bisphenol F-based epoxy resin, a bisphenol S-based epoxy resin, a bisphenol A novolac-based epoxy resin, a phenol novolac-based epoxy resin, a cresol novolac-based epoxy resin, a bisphenol A novolac-based epoxy resin, a brominated bisphenol A-based epoxy resin, a brominated phenol novolac-based epoxy resin, a trifunctional phenol-based epoxy resin, a tetrafunctional phenol-based epoxy resins, a naphthalene-based epoxy resin, an anthracene-based epoxy resin, a biphenyl-based epoxy resin, a phenol aralkyl-based epoxy resin, an aralkyl novolac-based epoxy resin, a biphenyl aralkyl-based epoxy resin, a naphthol aralkyl-based epoxy resin, a dicyclopentadiene-based epoxy resin, an alicyclic epoxy resin, a polyol-based epoxy resin, and a phosphorus-containing epoxy resin; a glycidyl amine epoxy resin; a glycidyl ester epoxy resin; a compound by epoxidation of the double bond of butadiene or the like; and a compound obtained by reaction of hydroxyl group-containing silicone resins and epichlorohydrin, but not being particularly limited thereto. The epoxy resins (A) may be used singly or in appropriate combinations of two or more depending on the desired performance.

Among these, from the viewpoint of having excellent properties in heat resistance, water absorption properties, heat resistance after moisture absorption and the like, an aralkyl-based epoxy resin such as a bisphenol A-based epoxy resin, a bisphenol F-based epoxy resin, a phenol novolac-based epoxy resin, a cresol novolac-based epoxy resin, a bisphenol A novolac-based epoxy resin, a brominated bisphenol A-based epoxy resin, a brominated phenol novolac-based epoxy resin, a biphenyl-based epoxy resin, a phenol aralkyl-based epoxy resin, a biphenyl aralkyl-based epoxy resin, a naphthol aralkyl-based epoxy resin is preferred as the epoxy resin (A).

Specific examples of the aralkyl-based epoxy resin include a phenyl aralkyl-based epoxy resin represented by the following general formula (5), a biphenyl aralkyl-based epoxy resin represented by the following general formula (6), and a naphthol aralkyl-based epoxy resin represented by the following general formula (7). Product examples of the epoxy resin represented by the following general formula (6) include NC-3000-FH made by Nippon Kayaku Co., Ltd.

[Formula 5]

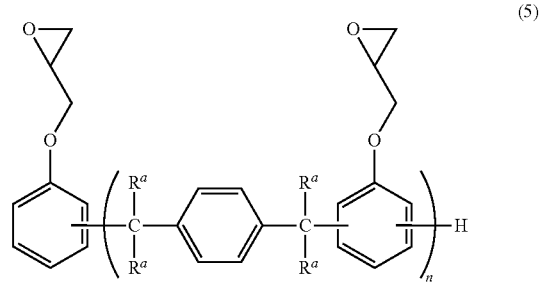

(5)

wherein each $R^a$ independently represents a hydrogen atom or a methyl group, and n represents an integer of 1 to 50.

[Formula 6]

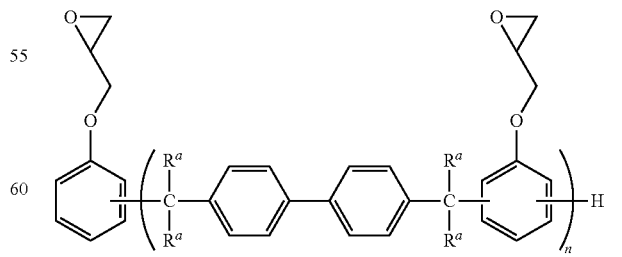

(6)

wherein each $R^a$ independently represents a hydrogen atom or a methyl group, and n represents an integer of 1 to 50.

[Formula 7]

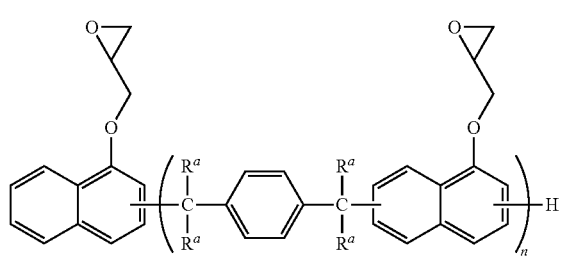

(7)

wherein each $R^a$ independently represents a hydrogen atom or a methyl group, and n represents an integer of 1 to 50.

The content of the epoxy resin (A) in the resin composition of the present embodiment may be appropriately set according to the desired performance without particular limitations, being preferably 10 to 90 parts by mass, more preferably 30 to 70 parts by mass, based on a total of 100 parts by mass of the epoxy resin (A) and the cyanate ester compound (B).

A commonly known compound represented by the general formula R—O—CN (wherein R represents an organic group) may be appropriately used as the cyanate ester compound (B) for use in the resin composition of the present embodiment, without particular limitations on the type. Specific examples thereof include a naphthol aralkyl-based cyanate ester compound represented by the general formula (1), a novolac-based cyanate ester compound represented by the general formula (2), a biphenyl aralkyl-based cyanate ester compound represented by the general formula (3), 1,3-dicyanatobenzene, 1,4-dicyanatobenzene, 1,3,5-tricyanatbenzene, bis(3,5-dimethyl-4-cyanatophenyl)methane, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, bis(4-cyanatophenyl)propane, bis(4-cyanatophenyl)ether, bis(4-cyanatophenyl)thioether, bis(4-cyanatophenyl)sulfone, 2,2'-bis(4-cyanatophenyl) propane, bis(3,5-dimethyl-4-cyanatophenyl)methane, being not particularly limited thereto. Among these, from the viewpoint of enhancing the flame retardancy, a naphthol aralkyl-based cyanate ester compound represented by the general formula (1), a novolac-based cyanate ester compound represented by the general formula (2), and a biphenyl aralkyl-based cyanate ester compound represented by the general formula (3) are preferred. The cyanate ester compounds (B) may be used singly or in appropriate combinations of two or more depending on the desired performance.

The cyanate ester compound (B) may be available from the market, or may be manufactured by a known method. More specifically, the naphthol aralkyl-based cyanate ester compound represented by the general formula (1) may be manufactured by, for example, a method described in Japanese Patent Laid-Open No. 2007-277102. As the novolac-based cyanate ester compound represented by the general formula (2), those commercially available from Lonza Japan Ltd. etc., can be suitably used. The biphenyl aralkyl-based cyanate ester compound represented by the general formula (3) may be manufactured by, for example, a method described in Japanese Patent Laid-Open No. 2010-174242.

The content of the cyanate ester compound (B) in the resin composition of the present embodiment may be appropriately set depending on the desired performance, without particular limitations, being preferably 10 to 90 parts by mass, more preferably 30 to 70 parts by mass, based on a total of 100 parts by mass of the epoxy resin (A) and the cyanate ester compound (B), from the viewpoint of heat resistance and curability.

The inorganic filler (C) for use in the resin composition of the present embodiment contains at least a surface-treated silicon carbide (C-1) of silicon carbide powder having at least a part of the surface treated with an inorganic oxide. In other words, the surface-treated silicon carbide (C-1) includes a core particle of silicon carbide powder and an inorganic oxide formed on at least a part of the surface of the core particle. In the surface-treated silicon carbide (C-1), silicon carbide powder having a high thermal conductivity is used as the core particle. In addition, the surface of the core particle is provided with an inorganic oxide, so that the powder surface is modified to have insulating properties. Use of the surface-treated silicon carbide (C-1) as, for example, the filler for a laminate or the like, therefore, achieves both high heat dissipation properties and insulating properties.

The average particle diameter (D50) of the silicon carbide powder for use as core particle can be appropriately set depending on the desired performance, without particular limitations. From the viewpoints of moldability, thermal conductivity, dispersibility, etc., the average particle diameter is preferably 0.5 to 20 μm, more preferably 3.0 to 18 μm. In the present specification, the average particle diameter (D50) means median diameter, at which the particle size distribution of a measured powder is divided into two equal amounts between the larger side and the smaller side. The average particle diameter (D50) means the value when the cumulative volume from small particles reaches 50% of the whole volume in the particle size distribution measurement of a predetermined amount of powder fed in a dispersion medium by a laser diffraction scattering particle size distribution measuring apparatus.

The silicon carbide powder may be manufactured by various known methods such as a pulverization method and a granulation method. The manufacturing method is not particularly limited. The commercial product of silicon carbide powder may be easily available from the market. Examples of the commercial product include SHINANO-RUNDUM CP/GP (brand name) made by Shinano Electric Refining Co., Ltd.

The inorganic oxide formed on the surface of silicon carbide powder as core particle may be applied to at least a part of the surface of silicon carbide powder. In other words, the inorganic oxide may be applied on a partial surface of the silicon carbide powder, or may be applied to cover the whole surface of the silicon carbide powder. From the viewpoint of forming a uniform and robust coating with high insulating properties, preferably the inorganic oxide is approximately uniformly applied to cover the whole surface of the silicon carbide powder. In other words, it is preferred that the surface of silicon carbide powder be provided with an approximately uniform coating of inorganic oxide.

The type of inorganic oxide covering the silicon carbide powder is not particularly limited, preferably being a metal oxide. Specific examples of the metal oxide include silica, titania, alumina, and zirconium oxide. Among these, from the viewpoints of thermal conductivity, heat resistance, and insulating properties, alumina is particularly preferred. The inorganic oxides may be used singly or in appropriate combinations of two or more depending on the desired performance.

The thickness of the inorganic oxide covering the silicon carbide powder may be appropriately set depending on the desired performance, without particular limitations. From the viewpoint of forming a uniform and robust coating with high insulating properties, preferably the inorganic oxide has a thickness of 10 to 70 nm, more preferably 15 to 50 nm.

Manufacturing method of the surface-treated silicon carbide (C-1) is not particularly limited. An inorganic oxide or a precursor thereof may be applied to the surface of the silicon carbide powder described above so as to produce the surface-treated silicon carbide (C-1) by various known methods including, for example, a sol-gel method, a liquid phase deposition method, a dip coating method, a spray coating method, a printing method, an electroless plating method, a sputtering method, a vapor deposition method, an ion plating method, and a CVD method. The method for applying an inorganic oxide or a precursor thereof to the surface of silicon carbide powder may be, therefore, any one of a wet method and a dry method. Coating of the surface of silicon carbide powder with an inorganic oxide allows the silicon carbide having semiconductivity to be insulated, enabling the use as an insulating composite material for improving the thermal conductivity of a resin composition, a printed wiring board, or the like.

Examples of the suitable manufacturing method of a surface-treated silicon carbide (C-1) include a method including the steps of: dispersing silicon carbide powder in an alcohol solution dissolving a metal alkoxide such as silicon alkoxide and aluminum alkoxide, dripping water, alcohol, a catalyst, or the like into the dispersed solution while stirring; hydrolyzing the alkoxide to form an insulating coating of silicon oxide, aluminum oxide, or the like on the powder surface, then solid-liquid separating the powder, and heat treating the powder after vacuum drying.

From the viewpoint of forming a uniform and robust coating with high insulating properties, the surface-treated silicon carbide (C-1) contains an inorganic oxide in an amount of, preferably 0.5 to 15 parts by mass, more preferably 1.0 to 10.0 parts by mass, further preferably 1.0 to 5.0 parts by mass, based on total 100 parts by mass of silicon carbide powder.

From the viewpoint of further enhancing the affinity for a resin and the insulation, the surface-treated silicon carbide (C-1) described above is preferably further treated with a coupling agent or the like. The treatment of the surface-treated silicon carbide (C-1) with a coupling agent or the like allows for further formation of a surface coating layer on the coating layer (inorganic oxide), resulting in further enhancement of the affinity for a resin and the insulation. More specifically, the surface-treated silicon carbide (C-1) having a surface coating layer on an inorganic oxide can be produced by dispersing the surface-treated silicon carbide (C-1) in a solvent to produce a slurry, adding a coupling agent to make a precursor of the surface coating layer, e.g. a hydrolysis solution of a silanol compound, to the slurry, and collecting and drying the powder by filtering or the like. From the viewpoints of uniform coating and insulation, a wet method is suitably used for forming the surface coating layer.

The content of the surface-treated silicon carbide (C-1) in the resin composition of the present embodiment may be appropriately set depending on the desired performance without particular limitations. From the viewpoints of heat dissipation properties, insulating properties, heat resistance, curability, and flame retardancy, the content of the surface-treated silicon carbide (C-1) is preferably 150 to 600 parts by mass, more preferably 200 to 500 parts by mass, further preferably 250 to 400 parts by mass, based on a total of 100 parts by mass of the resin solid components. In the present specification, the resin solid components mean the epoxy resin (A) and a cyanate ester compound, while in the case that the resin composition in the present embodiment contains the below-mentioned maleimide compound (D) and/or a polymer compound other than these, such as a thermosetting resin, a thermoplastic resin, and elastomers, the resin solid components include all of them.

From the viewpoint of further improving heat dissipation properties and insulating properties, the resin composition of the present embodiment may contain a second inorganic filler (C-2) as inorganic filler (C) other than the surface-treated silicon carbide (C-1). A known inorganic filler may be appropriately used as the second inorganic filler (C-2), without particular limitations on the type. An inorganic filler commonly used for a laminate or an electrical wiring board resin composition may be suitably used. Specific examples thereof include silica such as natural silica, fused silica, synthetic silica, amorphous silica, and hollow silica, boehmite, a molybdenum compound such as molybdenum oxide and zinc molybdate, alumina, clay, kaolin, talc, calcined talc, calcined clay, calcined kaolin, mica, E-glass, A-glass, NE-glass, C-glass, L-glass, D-glass, S-glass, M-glass G20, glass short fiber (including glass fine powder of E glass, T glass, D glass, S glass, Q glass, or the like), hollow glass, spherical glass, magnesium oxide, magnesium hydroxide, aluminum hydroxide, zinc oxide, zirconium oxide, barium sulfate, and boron nitride, not being particularly limited thereto. The second inorganic fillers (C-2) may be used singly or in appropriate combinations of two or more depending on the desired performance. Among these, from the viewpoint of achieving higher heat dissipation properties and insulating properties, alumina, magnesium oxide, boron nitride, and aluminum nitride are preferred, and alumina is particularly preferred.

A commercially available product may be used as alumina suitable for the second inorganic filler (C-2), including, for example, SUMICORUNDUM's AA-03, AA-04, AA-05, AA-07, AA-1, AA-2, AA-3, AA-10, and AA-18 made by Sumitomo Chemical Co., Ltd.; ASFP-20 and DAW-03, DAW-05, and DAW-07 made by DENKI KAGAKU KOGYO K.K.; AO-502 and AO-802 made by Admatechs Co., Ltd.; AX3-32, AX3-15, and AX10-32 made by NIPPON STEEL & SUMIKIN MATERIALS CO., LTD., Micron Co.; CB-P02, CB-P05, CB-P10, CBP-P10, CB-A09S, CB-A10S, CB-A10, CB-P15, and CB-A20X made by Showa Electric Industries Co., Ltd. These may be used singly or in appropriate combinations of two or more.

The average particle diameter (D50) of the second inorganic filler (C-2) may be appropriately set depending on the desired performance, not being particularly limited. Considering moldability, thermal conductivity, dispersibility, etc., the average particle diameter of the second inorganic filler (C-2) is preferably 0.2 to 20 µm. From the viewpoints of enhancing the filling ratio in the resin composition and reducing molding defects such as occurrence of voids during molding of a prepreg, use of a plurality of the second inorganic filler (C-2) having a different average particle diameter is preferred. For example, in the case of using two types of alumina having a different average particle diameter as the second inorganic filler (C-2), use of a first alumina having an average particle diameter of 0.5 to 10 µm, more preferably 1.5 to 7 μm, and a second alumina having an average particle diameter of 0.01 to 2 μm, more preferably 0.1 to 1.0 μm, is preferred.

The content of the second inorganic filler (C-2) in the resin composition of the present embodiment may be appropriately set depending on the desired performance without particular limitations. From the viewpoints of heat dissipation properties, insulating properties, heat resistance, flame retardancy, and the like, the content of the second inorganic filler (C-2) is preferably 150 to 500 parts by mass, more preferably 200 to 450 parts by mass, further preferably 250 to 400 parts by mass, based on a total of 100 parts by mass of the above-described resin solid components.

The total content of the inorganic filler (C) in the resin composition of the present embodiment, i.e. the total content of the surface-treated silicon carbide (C-1) and the second inorganic filler (C-2) which is compounded on an as needed basis, may be appropriately set depending on the desired performance, not being particularly limited, preferably 150 to 900 parts by mass, more preferably 200 to 800 parts by mass, further preferably 250 to 750 parts by mass, based on a total of 100 parts by mass of the above-mentioned resin solid components, from the viewpoints of heat dissipation properties, insulating properties, heat resistance, curability, flame retardancy, and the like.

The content of the surface-treated silicon carbide (C-1) in the inorganic filler (C) may be appropriately set depending on the desired performance without particular limitations, preferably 30 to 100 parts by mass, more preferably 50 to 100 parts by mass based on a total of 100 parts by mass of the inorganic filler (C), from the viewpoint of heat dissipation properties.

In use of the above-mentioned inorganic filler (C), the resin composition of the present embodiment may further contain a silane coupling agent and a dispersing agent on an as needed basis. Inclusion of a silane coupling agent and a dispersing agent can improve dispersibility of the above-mentioned surface-treated silicon carbide (C-1) and second inorganic filler (C-2). As the silane coupling agent, one for general use in surface treatment of an inorganic material may be used without particular limitations on the type. Specific examples thereof include aminosilanes such as γ-aminopropyltriethoxysilane and N-β-(aminoethyl)-γ-aminopropyltrimethoxysilane, epoxysilanes such as γ-glycidoxypropyltrimethoxysilane, vinylsilanes such as γ-methacryloxypropyltrimethoxysilane, cationic silanes such as N-β-(N-vinylbenzylaminoethyl)-γ-aminopropyltrimethoxysilane hydrochloride, and phenyl silanes, not being particularly limited thereto. The silane coupling agents may be used singly or in appropriate combinations of two or more. As the dispersing agent, one for general use in coating materials may be used, without particular limitations on the type. Preferably, a copolymer-based wetting and dispersing agent is used, and specific examples thereof include DISPERBYK-110, 111, 180 and 161, BYK-W996, BYK-W9010, BYK-W903, and BYK-W940 made by BYK Japan K.K. The wetting and dispersing agents may be used singly or in appropriate combinations of two or more.

The resin composition of the present embodiment may further contain a maleimide compound (D) on an as needed basis. Inclusion of a maleimide compound (D) tends to still further enhance the heat resistance, the heat resistance after moisture absorption, and the flame resistance. As the maleimide compound (D), a known compound having a maleimide group may be appropriately used without particular limitations on the type. Specific examples thereof include N-phenyl maleimide, N-hydroxyphenylmaleimide, bis(4-maleimidophenyl)methane, 2,2-bis{4-(4-maleimidephenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, maleimide compounds represented by the general formula (4), prepolymers of these maleimide compounds, and prepolymers of maleimide compounds and amine compounds, not being particularly limited thereto. Among these, bis(4-maleimidophenyl)methane, 2,2-bis{4-(4-maleimidephenoxy)-phenyl}propane, bis(3-ethyl-5-methyl-4-maleimidophenyl)methane, and maleimide compounds represented by the general formula (4) are preferred, from the viewpoints of heat resistance, heat resistance after moisture absorption, flame resistance, and the like. These may be used singly or in appropriate combinations of two or more.

The content of maleimide compound (D) in the resin composition of the present embodiment may be appropriately set depending on the desired performance, not being particularly limited. From the viewpoints of heat resistance after moisture absorption, flame resistance, and the like, the content of maleimide compound (D) is preferably 5 to 50 parts by mass, more preferably 5 to 20 parts by mass, based on a total of 100 parts by mass of the epoxy resin (A), the cyanate ester compound (B) and the maleimide compound (D).

In the case of the resin composition of the present embodiment containing the maleimide compound (D), the content of epoxy resin (A) is preferably 10 to 90 parts by mass, more preferably 30 to 70 parts by mass, based on a total of 100 parts by mass of the epoxy resin (A), the cyanate ester compound (B), and the maleimide compound (D).

Likewise, in the case of the resin composition of the present embodiment containing the maleimide compound (D), the content of cyanate ester compound (B) is preferably 10 to 90 parts by mass, more preferably 30 to 70 parts by mass, based on a total of 100 parts by mass of the epoxy resin (A), the cyanate ester compound (B), and the maleimide compound (D).

Further, the resin composition of the present embodiment may contain a curing accelerator for appropriately adjusting the curing rate on an as needed basis. As the curing accelerator, one for general use for cyanate ester compounds and epoxy resins may be used without particular limitations on the type. Specific examples thereof include organic metal salts of copper, zinc, cobalt, nickel and the like, imidazoles and derivatives thereof, and tertiary amines, not being particularly limited thereto. These curing accelerators may be used singly or in appropriate combinations of two or more.

Furthermore, the resin composition of the present embodiment may contain components other than the above, to the extent that expected properties are not compromised. Examples of such an optional compound include various polymer compounds such as a thermosetting resin, a thermoplastic resin, oligomers thereof, and elastomers other than those mentioned above, a flame retardant compound other than those mentioned above, and various additives. As these optional compounds, ones commonly used in the arts may be appropriately used, without particular limitations on the type. Examples of the flame retardant compound other than those mentioned above include bromine compounds such as 4,4'-dibromobiphenyl, phosphate ester, melamine phosphate, phosphorus-containing epoxy resins, nitrogen-containing compounds such as melamine and benzoguanamine, oxazine ring-containing compounds, and silicone-based compounds. Examples of the various additives include an ultraviolet absorber, an antioxidant, a photopolymerization initiator, a fluorescent whitening agent, a photosensitizer, a dye, a pigment, a thickener, a lubricant, a defoaming agent, a dispersing agent, a leveling agent, a brightening agent, and a polymerization inhibitor, not being particularly limited thereto. These optional compounds may be used singly or in appropriate combinations of two or more.

The resin composition of the present embodiment may be prepared according to a conventional method, and the preparation method is not particularly limited. The resin composition of the present embodiment can be easily prepared by stirring and mixing the above-mentioned epoxy resin (A), cyanate ester compound (B), inorganic filler (C), and the like. In preparation of the resin composition, known treatments (stirring, mixing, kneading and the like) may be performed to achieve uniform mixing of each component. The stirring, mixing, and kneading may be appropriately performed using a known apparatus for mixing such as a ball mill, a bead mill or a homomixer.

The resin composition of the present embodiment may be dissolved in an organic solvent to make a solution of the resin composition for use on an as needed basis, from the viewpoints of reducing viscosity for improvement in handleability, enhanced impregnation of glass cloth, and the like. In other words, the resin composition of the present embodiment may be used in an aspect that at least a part or preferably the whole of the components described above is dissolved in or compatible with an organic solvent (a resin varnish). As the organic solvent, a known organic solvent may be appropriately used as long as capable of dissolving or being compatible with at least a part, preferably the whole, of the resin solid components such as the epoxy resin (A), cyanate ester compound (B), and maleimide compounds (D) described above, without particular limitations on the type. Specific examples thereof include ketones such as acetone, methyl ethyl ketone, and methyl isobutyl ketone, polar solvents such as dimethylacetamide and dimethylformamide, and aromatic hydrocarbons such as toluene and xylene, not being particularly limited thereto. The organic solvents may be used singly or in appropriate combinations of two or more.

Meanwhile, the prepreg of the present embodiment is made of the above-mentioned resin composition which a substrate is impregnated with or which is attached to a substrate. The prepreg can be prepared by a conventional method, which is not particularly limited. The prepreg of the present embodiment may be obtained by, for example, preparing a substrate impregnated with or coated with a resin varnish including the resin composition with an organic solvent, and semi-curing (B-staging) the resin varnish by heating in a dryer at 100 to 200° C. for 1 to 60 minutes. On this occasion, the amount of the resin composition adhered to the substrate, i.e. the amount of the resin composition (including the inorganic filler (C)) based on the total amount of the semi-cured prepreg, is not particularly limited, preferably in the range of 20 to 95% by mass. The drying conditions are not particularly limited. Drying is generally performed such that the content ratio of the organic solvent in the resin composition reaches 10% by mass or less, preferably 5% by mass or less. Although the conditions are different depending on the amount of organic solvent in the resin varnish, for example, a resin varnish containing 30 to 60% by mass organic solvent may be dried at 50 to 150° C. for about 3 to 10 minutes.

The substrate for use in the prepreg of the present embodiment is not particularly limited, and may be appropriately selected from known ones for use in, for example, various printed wiring board materials, according to the intended application and performance. Specific examples thereof include woven cloth or nonwoven cloth of E-glass, D-glass, S-glass, T-glass, NE-glass, quartz, polyimide, polyamide, polyester, and liquid crystal polyester, not being particularly limited thereto. These may be used singly or in appropriate combinations of two or more. The thickness of the substrate is not particularly limited, preferably in the range of 0.01 to 0.3 mm. Among them, woven cloth with ultra-opening treatment or clogging treatment widely used in the application for laminates is suitable in terms of dimensional stability. A woven glass cloth with surface treatment by a silane coupling agent such as epoxy silane treatment or amino silane treatment is preferred in terms of heat resistance after moisture absorption. Further, a liquid crystal polyester woven cloth is preferred in terms of electrical properties.

Meanwhile, the metal foil clad laminate of the present embodiment is made by lamination molding of the above-mentioned prepreg and a metal foil. More specifically, the metal foil clad laminate can be made by stacking one or a plurality of the prepregs described above and disposing a metal foil of copper, aluminum, or the like on a single side or both sides thereof followed by lamination molding. The molding conditions are not particularly limited, and methods for commonly used laminates and multilayer boards for printed wiring boards may be applicable. The lamination molding is generally performed at a temperature of 180 to 220° C., in a heating time of 100 to 300 minutes, at a surface pressure of 20 to 40 kgf/cm$^2$, using, for example, a multi-stage press, a multi-stage vacuum press, a continuous molding machine, or an autoclave molding machine. The metal foil for use is not particularly limited as long as being applicable as printed wiring board materials, preferably a copper foil such as a rolled copper foil or an electrolyte copper foil. Considering the conductor loss in a high frequency region, an electrolyte copper foil is more preferred, having a matte surface with small roughness. The thickness of the metal foil is not particularly limited, preferably 2 to 70 μm, more preferably 3 to 35 μm.

The method for manufacturing a multilayer board includes, for example, disposing a 35 μm thick copper foil on both sides of the prepreg, forming an inner layer circuit after lamination molding under the conditions described above, and blackening the circuit to form an inner layer circuit board. The inner layer circuit board and the prepreg are stacked for lamination molding to form a multilayer board. Alternatively the prepreg and an inner layer wiring board separately prepared may be stacked for lamination molding to form a multilayer board.

The metal foil clad laminate provided with a predetermined wiring pattern may be used as a printed wiring board. The metal foil clad laminate excellent in heat dissipation properties, water absorption properties, copper foil peel strength, heat resistance after moisture absorption and the like, is particularly useful for semiconductor package applications which require such performance.

The printed wiring board may be manufactured by, for example, the following method. First, a metal foil clad laminate such as the copper clad laminate described above is prepared. The surface of the metal foil clad laminate is then etched to form an inner layer circuit, so that an inner layer substrate is prepared. A surface treatment for enhancing the adhesion strength is applied to the surface of the inner layer circuit of the inner layer substrate on an as needed basis. Subsequently a required number of the prepregs described above are stacked on the surface of the inner layer circuit. A metal foil for an outer layer circuit is further stacked on the outside of the prepreg. The whole is integrally molded by application of heat and pressure. In this way, a multilayer laminate is manufactured, including an insulating layer, composed of a substrate and a cured material of the resin composition of the present embodiment described above, between the inner layer circuit and the metal foil for the outer layer circuit. Subsequently, a printed wiring board is manufactured by boring through holes and via holes in the multilayer laminate, then forming a plated metal coating on the wall face of the holes for conducting between the inner layer circuit and the metal foil for the outer layer circuit, and etching the metal foil for the outer layer circuit to form the outer layer circuit. The printed wiring board shown in the manufacturing example includes a laminate of the inner layer circuit and the outer layer circuit as a conductive layer, and the prepreg (the substrate and the resin composition of the present embodiment which the substrate is impregnated with or which is attached to the substrate) and the resin composition layer (layer including a cured material of the resin composition of the present embodiment) of the metal foil clad laminate as an insulating layer.

EXAMPLES

The following synthesis examples, examples and comparative examples illustrate the present invention in detail, but the present invention is not limited thereto. Unless otherwise specified below, the term "parts" represents "parts by mass".

Preparation Example 1 Synthesis of α-naphthol aralkyl-Based Cyanate Ester Compound A reaction vessel equipped with a thermometer, a stirrer, a dripping funnel, and a reflux condenser was cooled at 0 to 5° C. with brine in advance. Into the reaction vessel, 7.47 g (0.122 mol) of cyanogen chloride, 9.75 g (0.0935 mol) of 35% hydrochloric acid, 76 ml of water, and 44 ml of methylene chloride were fed. While the mixture in the vessel was kept at a temperature of −5 to +5° C. and a pH of 1 or less, a solution including 20 g (0.0935 mol) of an α-naphthol aralkyl resin (SN485, OH group equivalent: 214 g/eq., softening point: 86° C., made by Nippon Steel Chemical Co., Ltd.) and 14.16 g (0.14 mol) of triethylamine dissolved in 92 ml of methylene chloride was dripped into the reaction vessel through a dripping funnel for 1 hour under stirring. After completion of dripping, 4.72 g (0.047 mol) of triethylamine was further dripped for 15 minutes.

After completion of dripping, the reaction liquid was stirred for 15 minutes at the same temperature and then separated to isolate an organic layer. The produced organic layer was washed with 100 ml of water twice, and methylene chloride was then distilled with an evaporator under reduced pressure. Finally, 23.5 g of a cyanate ester compound of α-naphthol aralkyl resin represented by the general formula (1) (α-naphthol aralkyl-based cyanate ester compound, wherein each R is a hydrogen atom and n represents 1 to 5.) was produced by condensation to dryness at 80° C. for 1 hour.

In the analysis of the produced cyanate ester compound by liquid chromatography and IR spectroscopy, no raw material peak was detected, and the absorption of a cyanate ester group at around 2264 cm$^{-1}$ was confirmed. The structure was identified by $^{13}$C-NMR and $^1$H-NMR. The conversion rate from hydroxyl groups to cyanate groups was 99% or more.

Manufacturing Example 1 Manufacturing of Alumina-Coated Silicon Carbide Powder 3.5 g of aluminum diisopropylate mono secondary butyrate was dissolved in 1000 ml of isopropyl alcohol. Into the solution, 100 g of silicon carbide powder (GP#800, made by Shinano Electric Refining Co., Ltd., average particle diameter: 14 μm) was fed, and the silicon carbide powder and the solution were mixed and stirred such that the silicon carbide powder was dispersed throughout the solution. A slurry solution was thus obtained. While maintaining the slurry state, 5 g of pure water was then added to the produced slurry solution, which was stirred and matured at 30° C. for 60 minutes for performing a hydrolysis reaction. The treated silicon carbide powder was then taken out and washed with several tens mL of acetone. Acetone was then evaporated by drying, so that alumina-coated silicon carbide powder was produced, having an alumina coating layer uniformly formed on the surface of the silicon carbide powder.

Example 1

A resin composition (resin varnish) was obtained by solution mixing 40 parts by mass of α-naphthol aralkyl-based cyanate ester compound obtained in the Synthetic Example 1, 20 parts by mass of bis(3-ethyl-5-methyl-4-maleimidophenyl)methane (BMI-70, made by K.I Chemical Industry Co., Ltd.), 40 parts by mass of biphenyl aralkyl-based epoxy resin (NC-3000-FH, made by Nippon Kayaku Co., Ltd.), 15 parts by mass of a silane coupling agent (Z6040, made by Dow Corning Toray Co., Ltd.), and 5 parts by mass of an acid group-containing wetting and dispersing agent (BYK-W903, made by BYK Japan K.K.) in methyl ethyl ketone to produce a mixed solution, and by mixing 290 parts by mass of the alumina-coated silicon carbide powder obtained in Manufacturing Example 1, 0.01 parts by mass of manganese octoate (NIKKA OCTHIX Mn, made by Nihon Kagaku Sangyo Co., Ltd., Mn content: 8%), and 0.5 parts by mass of 2,4,5-triphenylimidazole (made by Tokyo Chemical Industry Co., Ltd.) with the produced mixed solution.

The produced resin varnish was diluted with methyl ethyl ketone to have a solid content concentration of 65 wt. %. The diluted varnish was applied to an E-glass cloth (made by Asahi Kasei E-materials Corp.) having a thickness of 0.1 mm and a mass of 47.2 g/m$^2$ so as to produce an impregnation coating, which was then heated and dried at 160° C. for 3 minutes so as to produce a prepreg having a resin composition content of 80% by mass. Subsequently, 8 sheets of the prepreg were stacked to form a layered product. On each of both sides of the layered product, an electrolyte copper foil having a thickness of 12 μm (3EC-III, made by MITSUI MINING & SMELTING CO., LTD.) was disposed for lamination molding by vacuum pressing under a pressure of 30 kgf/cm$^2$ at a temperature of 220° C. for 120 minutes. As a result, a metal foil clad laminate (double sided copper clad laminate) having a thickness of 0.8 mm was produced.

The thermal conductivity, peel strength, water absorption rate, heat resistance after moisture absorption, and electrical resistance of the produced metal foil clad laminates were measured and the appearance thereof was evaluated.
Measurement Method
1) Thermal Conductivity The density of the produced metal foil clad laminate was measured. The specific heat was measured by DSC (Q100 type, made by TA Instruments). The thermal diffusivity was measured with a xenon flash analyzer (Bruker: LFA447 Nanoflash). The thermal conductivity was calculated from the following expression.

Thermal conductivity(W/m·K)=Density(kg/m$^3$)×Specific heat(kJ/kg·K)×Thermal diffusivity(m$^2$/S)×1000

2) Copper Foil Peel Strength

Measurement was performed in accordance with JIS C6481 "Test methods of copper-clad laminates for printed wiring boards" (refer to 5.7 Peel strength).

3) Heat Resistance after Moisture Absorption

The produced metal foil clad laminate was cut into sizes of 50 mm by 50 mm by 0.8 mm thick with a dicing saw, and all the copper foils other than the half on a single side were then removed by etching, so that a test piece with the remained half copper foil on a single side only was obtained. The change in appearance of the test pieces was visually observed after treating at 121° C. under 2 atm for 3 hours with a pressure cooker tester (PC-3 type, made by HIRAYAMA MANUFACTURING CORPORATION) and then immersing in a solder tank at 260° C. for 60 seconds (number of generation of blisters/number of testings).

4) Water Absorption Rate

After treatment at 121° C. under 2 atm for 5 hours with a pressure cooker tester (PC-3 type, made by HIRAYAMA MANUFACTURING CORPORATION), the ratio of change in weight before and after the treatment was calculated.

5) Electrical Resistance

In accordance with JIS K-6911, after one minute elapsed from application of 500 V to electrodes, the electrical resistance value was measured with an insulation resistance meter.

6) Appearance Evaluation

The produced metal clad laminate was cut into sizes of 520 mm by 340 mm by 0.8 mm, and all the copper foils on both sides were then removed by etching, so that a sample (laminate) with no copper foil on the surface was obtained. The laminate was visually observed, and a laminate having good appearance was evaluated as "good", and a laminate having color heterogeneity was evaluated as "poor".

Example 2

A resin composition and a double sided copper clad laminate were obtained in the same way as in Example 1, except that 215 parts by mass of non-spherical alumina (AA-3, made by Sumitomo Chemical Co., Ltd., average particle diameter: 3 μm), 85 parts by mass of alumina (ASFP-20, made by DENKI KAGAKU KOGYO K.K., average particle diameter: 0.3 μm), and 300 parts by mass of the alumina-coated silicon carbide powder used in Example 1 were used as inorganic filler.

Example 3

A resin composition and a double sided copper clad laminate were obtained in the same way as in Example 1, except that 190 parts by mass of non-spherical alumina (AA-3), 140 parts by mass of alumina (ASFP-20), and 350 parts by mass of the alumina-coated silicon carbide powder used in Example 1 were used as inorganic filler.

Example 4

A resin composition and a double sided copper clad laminate were obtained in the same way as in Example 3, except that the compounding amount of α-naphthol aralkyl-based cyanate ester compound was changed to 50 parts by mass, and the compounding amount of biphenyl aralkyl-based epoxy resin was changed to 50 parts by mass, respectively, without compounding of bis(3-ethyl-5-methyl-4-maleimidophenyl)methane.

Comparative Example 1

A resin composition and a double sided copper clad laminate were obtained in the same way as in Example 1, except that 500 parts by mass of spherical alumina (AX3-15, made by Nippon Steel & Sumikin Materials Co., Ltd., Micron Co., average particle diameter: 3 μm) was used as inorganic filler, and the compounding amount of silane coupling agent was changed to 13 parts by mass.

Comparative Example 2

A resin composition and a double sided copper clad laminate were obtained in the same way as in Example 1, except that 800 parts by mass of non-spherical alumina (AA-3) and 200 parts by mass of alumina (ASFP-20) were used as inorganic filler.

Comparative Example 3

A resin composition and a double sided copper clad laminate were obtained in the same way as in Example 1, except that 290 parts by mass of silicon carbide powder (GP#800, made by Shinano Electric Refining Co., Ltd., average particle diameter: 14 μm) was used as inorganic filler.

Comparative Example 4

A resin composition and a double sided copper clad laminate were obtained in the same way as in Example 1, except that 310 parts by mass of non-spherical alumina (AA-3), 125 parts by mass of alumina (ASFP-20), and 125 parts by mass of aggregated boron nitride (SGPS, made by DENKI KAGAKU KOGYO K.K., 12 μm) were used as inorganic filler.

The evaluation results are shown in Table 1.

TABLE 1

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Thermal conductivity xy-axis [W/m · K] | 3.0 | 4.5 | 5.0 | 5.1 | 2.0 | 3.8 | 3.4 | 5.2 |
| Copper foil peel strength [kgf/cm] | 1.0 | 1.0 | 1.0 | 1.0 | 1.0 | 1.0 | 1.0 | 0.7 |
| Heat resistance after moisture absorption [number of generation | 0/3 | 0/3 | 0/3 | 0/3 | 0/3 | 0/3 | 0/3 | 3/3 |

TABLE 1-continued

| | Example 1 | Example 2 | Example 3 | Example 4 | Comparative Example 1 | Comparative Example 2 | Comparative Example 3 | Comparative Example 4 |
|---|---|---|---|---|---|---|---|---|
| of blisters/number of testings] | | | | | | | | |
| Water absorption rate [wt. %] | 0.3 | 0.3 | 0.3 | 0.3 | 0.3 | 0.3 | 0.3 | 0.3 |
| Insulation resistance [Ω] | 3.0E+14 | 3.8E+14 | 4.0E+15 | 4.8E+15 | 1.0E+16 | 1.0E+16 | 1.7E+10 | 3.0E+15 |
| Appearance evaluation | Good | Good | Good | Good | Good | Poor | Good | Poor |

As shown in Table 1, it was confirmed that the laminates in Examples 1 to 4 have higher performance levels in all of the heat dissipation properties, copper foil peel strength, heat resistance after moisture absorption, water absorption properties, insulation resistance, and moldability, than the laminates in Comparative Examples 1 to 4.

This application claims a priority based on Japanese Patent Application (Japanese Patent Application No. 2012-132685) filed with the Japan Patent Office on Jun. 12, 2012, of which content is incorporated herein by reference.

INDUSTRIAL APPLICABILITY

As described above, the present invention can be widely and effectively used in laminate materials, electrical insulating materials, buildup laminate materials, printed wiring boards, semiconductor plastic packages or the like.

The invention claimed is:

1. A resin composition comprising an epoxy resin (A), a cyanate ester compound (B), an inorganic filler (C), wherein the inorganic filler (C) comprises a surface-treated silicon carbide (C-1) of a silicon carbide powder having the surface treated with an inorganic oxide, and a maleimide compound (D) selected from at least one or more of the group consisting of bis(4-maleimidophenyl)methane, 2,2-bis(4-(4-maleimidephenoxy)-phenyl)propane, bis(3-ethyl-5-methyl-4-maleimidophenyl)methane, and a maleimide compound represented by the following formula (4):

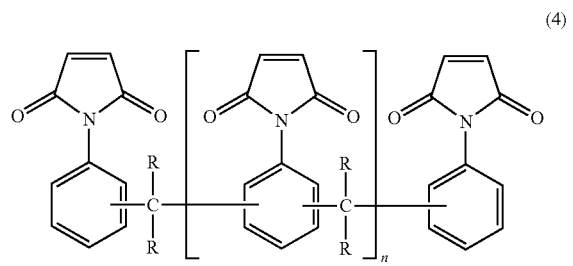

(4)

wherein each R independently represents a hydrogen atom or a methyl group, and n represents an integer of 1 to 10 as an average value; and
wherein the inorganic filler (C) is contained in an amount of 150 to 900 parts by mass based on a total of 100 parts by mass of resin solid components.

2. The resin composition according to claim 1, wherein the inorganic oxide with which the surface of the silicon carbide is treated is at least one or more selected from the group consisting of silica, titania, alumina, and zirconium oxide.

3. The resin composition according to claim 1, wherein the inorganic filler (C) further comprises at least one or more second inorganic fillers (C-2) selected from the group consisting of alumina, magnesium oxide, boron nitride, and aluminum nitride, other than the surface-treated silicon carbide (C-1).

4. The resin composition according to claim 1, wherein the epoxy resin (A) is at least one or more selected from the group consisting of a biphenyl aralkyl-based epoxy resin, a polyoxynaphthylene-based epoxy resin, a triphenolmethane-based epoxy resin, a bisphenol A-based epoxy resin, a bisphenol F-based epoxy resin, a phenol novolac-based epoxy resin, a cresol novolac-based epoxy resin, a bisphenol A novolac-based epoxy resin, a brominated bisphenol A-based epoxy resin, a brominated phenol novolac-based epoxy resin, a biphenyl-based epoxy resin, a phenol aralkyl-based epoxy resin, and naphthol aralkyl-based epoxy resin.

5. The resin composition according to claim 1, wherein the cyanate ester compound (B) is at least one or more selected from the group consisting of a naphthol aralkyl-based cyanate ester compound represented by the following formula (1), a novolac-based cyanate ester compound represented by the following formula (2), and a biphenyl aralkyl-based cyanate ester compound represented by the following formula (3):

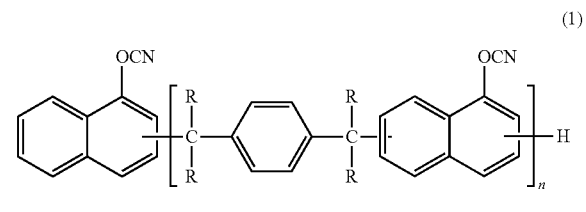

(1)

wherein each R independently represents a hydrogen atom or a methyl group, and n represents an integer of 1 or more;

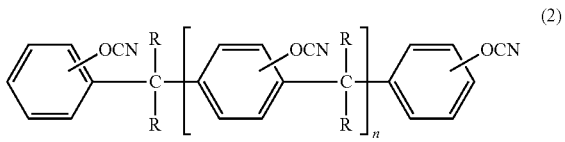

(2)

wherein each R independently represents a hydrogen atom or a methyl group, and n represents an integer of 0 or more;

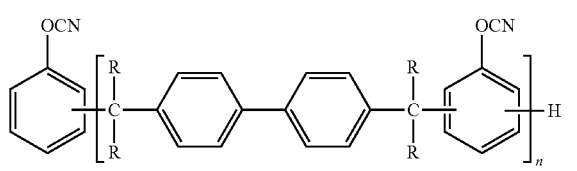 (3)

wherein each R independently represents a hydrogen atom or a methyl group, and n represents an integer of 1 or more.

6. The resin composition according to claim 1,
wherein the maleimide compound (D) is present in an amount of 5 to 50 parts by mass based on a total of 100 parts by mass of the epoxy resin (A), the cyanate ester compound (B), and the maleimide compound (D).

7. The resin composition according to claim 1,
wherein the epoxy resin (A) is contained in an amount of 10 to 90 parts by mass based on a total of 100 parts by mass of the epoxy resin (A), the cyanate ester compound (B), and the maleimide compound (D).

8. The resin composition according to claim 1,
wherein the cyanate ester compound (B) is contained in an amount of 10 to 90 parts by mass based on a total of 100 parts by mass of the epoxy resin (A), the cyanate ester compound (B), and the maleimide compound (D).

9. A prepreg comprising a substrate and the resin composition according to claim 1 which the substrate is impregnated with or which is attached to the substrate.

10. A metal foil clad laminate comprising the prepreg according to claim 9 as an insulating layer, and a metal foil disposed on a single side or both sides of the prepreg.

11. A printed wiring board comprising an insulating layer and a conductive layer formed on the surface of the insulating layer, wherein the insulating layer comprises the resin composition according to claim 1.

* * * * *